United States Patent [19]

Iemura

[11] Patent Number: 5,661,753

[45] Date of Patent: Aug. 26, 1997

[54] DECISION FEEDBACK EQUALIZER HAVING LEAKY TAP GAIN CONTROLLERS

[75] Inventor: Takaya Iemura, Tokyo, Japan

[73] Assignee: NEC Corporation, Tokyo, Japan

[21] Appl. No.: 594,578

[22] Filed: Jan. 31, 1996

[30] Foreign Application Priority Data

Jan. 31, 1995 [JP] Japan .................................. 7-034268

[51] Int. Cl.$^6$ ............................ H03H 7/30; H03H 7/40
[52] U.S. Cl. ......................... 375/233; 375/230; 375/232
[58] Field of Search ................................ 375/233, 230, 375/232; 364/724.2

[56] References Cited

U.S. PATENT DOCUMENTS

| | | | |
|---|---|---|---|
| 3,992,616 | 11/1976 | Acker | 235/156 |
| 5,230,006 | 7/1993 | Kurokami | 375/14 |
| 5,333,149 | 7/1994 | Vicard | 375/14 |
| 5,367,536 | 11/1994 | Tsujimoto | 375/42 |
| 5,398,259 | 3/1995 | Tsujimoto | 375/233 |
| 5,440,583 | 8/1995 | Koike | 375/233 |

OTHER PUBLICATIONS

Li et al., "Rejection of CW Interference in QPSK Systems Using Decision-Feedback Filters", IEEE Transactions on Communications, vol. COM-31, No. 4, pp. 473-483, (1983).

*Primary Examiner*—Stephen Chin
*Assistant Examiner*—Mohammad Ghayour
*Attorney, Agent, or Firm*—Foley & Lardner

[57] ABSTRACT

The forward filter of a decision feedback equalizer has a tapped delay line fox receiving an input signal to produce successively delayed tap signals, which are multiplied by respective tap-gain coefficients, and summed together. The outputs of the forward and backward filters of the equalizer are combined and a threshold decision is made on the combined signal to produce a decision output, from which a decision error is detected. The backward filter has a tapped delay line for receiving the decision output to produce successively delayed tap signals, which are multiplied by respective tap-gain coefficients, and summed together to product its output. Correlations between the tap signals of the forward and backward filters and the decision error are detected and the correlations are modified and supplied to the forward and backward filters as the tap-gain coefficients so that each of the tap-gain coefficients of the forward and backward filters converges toward zero. A spectral notch is formed in the frequency response of the forward filter to cancel continuous wave interference and intersymbol interference produced as a result of the spectral notch is canceled by the backward filter.

1 Claim, 2 Drawing Sheets

DECISION FEEDBACK EQUALIZER HAVING LEAKY TAP GAIN CONTROLLERS

BACKGROUND OF THE INVENTION

1. Field of the Invention

The present invention relates to a decision feedback equalizer used for canceling CW (continuous wave) interference.

2. Description of the Related Art

As described in an article "Rejection of CW Interference in QPSK Systems Using Decision-Feedback Filters", L. Li and L. B. Milstein, a. IEEE Transactions on Communications, Vol. COM-31, No. 4, April 1983, decision feedback equalizers include a forward transversal filter whose reference tap is located at the center of its tapped delay line for compensating for the deleterious effect of CW interference on the quality of transmitted signal, and a backward filter for canceling intersymbol interference. While satisfactory for operation during the presence of CW interference, a sudden absence of the CW interference causes the tap-gain coefficients of the forward filter to remain at the value which they attained at the time just prior to the disappearance of the CW interference. Since such conditions persist for a certain length of time, an increase in bit error rate results. Moreover, if new CW interference of different frequency occurs in the absence of the previous CW interference, the equalizer encounters instability and the tap-gain coefficients of both forward and backward filters diverge out of control.

SUMMARY OF THE INVENTION

It is therefore an object of the present invention to provide a decision feedback equalizer capable of satisfactory operation regardless of the presence or absence of CW interference.

According to the present invention, there is provided a decision feedback equalizer comprising a forward filter and a backward filter. The forward filter has a tapped delay line for receiving an input signal to produce successively delayed tap signals, a plurality of tap-gain multipliers for multiplying the tap signals by respective tap-gain coefficients, and an adder for summing outputs of the tap-gain multipliers, the forward filter forming a spectral notch in the frequency response thereof for canceling continuous wave interference contained in the received signal. A combiner has a first input to receive an output of the forward filter and a second input to receive an output of the backward filter. A decision circuit receives the output of the combiner to produce a derision output. A decision error detector is connected to the decision circuit for detecting a decision error of the decision output. The backward filter ha a tapped delay line for receiving the decision output to produce successively delayed tap signals, a plurality of tap-gain multipliers for multiplying the delayed tap signals by respective tap-gain coefficients, and an adder for summing outputs of the tap-gain multipliers and applying an output of the adder to the second input of the combiner, the backward filter canceling intersymbol interference produced in the decision output as a result of the spectral notch of the forward filter. A plurality of correlators are connected to respectively receive the tap signals of the forward and backward filters. Each of the correlators detects a correlation between the decision error and the respective tap signal of one of the forward and backward filters. A plurality of leakage means are connected respectively to the correlators for modifying the correlations and supplying the modified correlators for modifying the correlations and supplying the modified correlations to the forward and backward filters as the tap-gain coefficients so that the tap-gain coefficients converge toward zero.

BRIEF DESCRIPTION OF THE DRAWINGS

The present invention will be described in further detail with reference to the accompanying drawings, in which.

DETAILED DESCRIPTION

Figure 1:
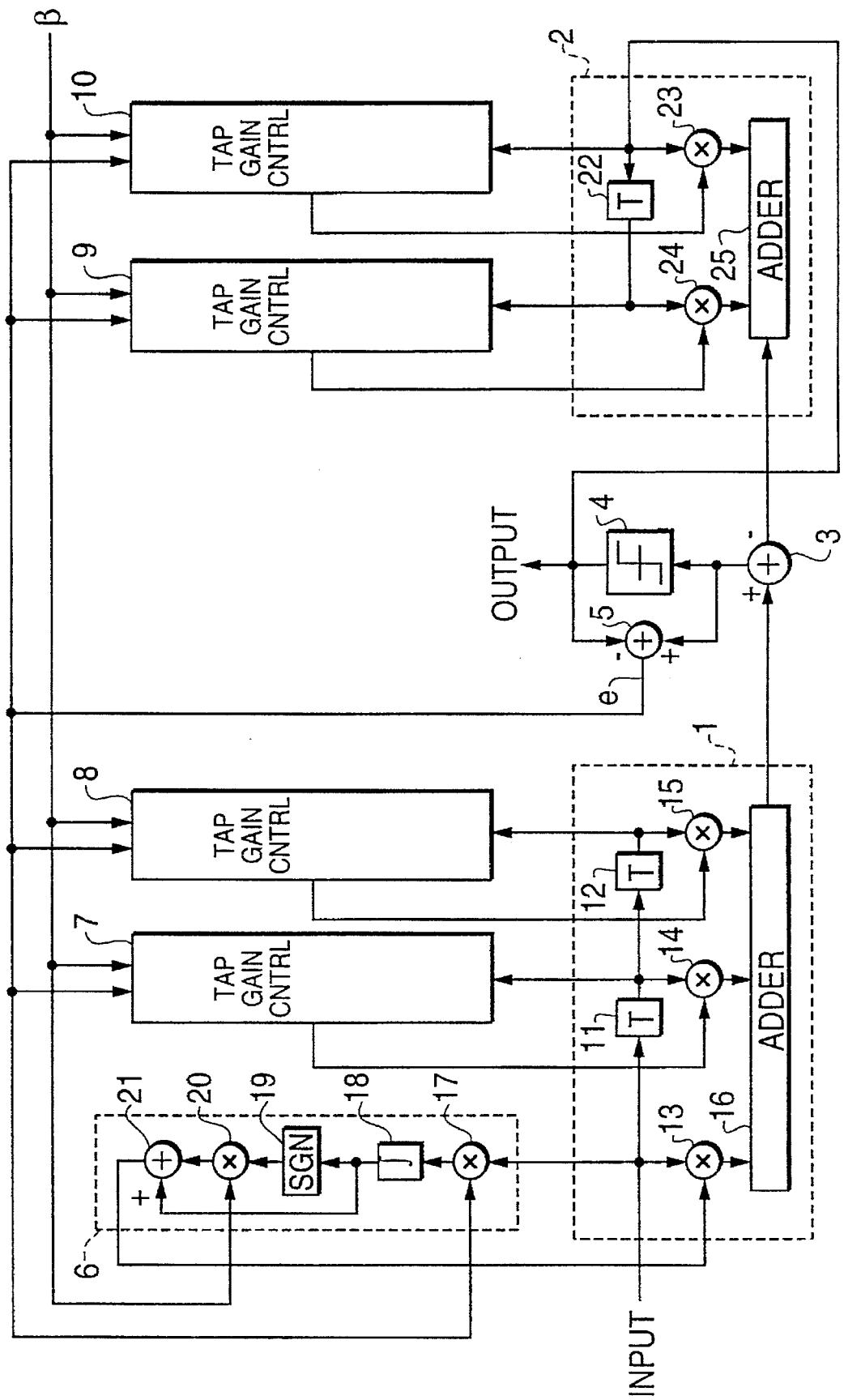
FIG. 1 is a block diagram of a decision feedback equalizer of the present invention.

In FIG. 1, a decision feedback equalizer of the present invention generally comprises a forward transversal filter 1, a backward transversal filter 2, a subtractor 3, a decision circuit 4, an error detector 5, and a plurality of tap-gain controllers 6 to 10.

The forward filter 1 has a series of delay elements 11 and 12 to form a tapped delay line where input digital baseband signal is successively delayed by symbol intervals T and appears successively at the taps of the delay line. The tap signals on the delay line are weighted by respective tap-gain coefficients in multipliers 13, 14 and 15, producing weighted signals which are summed together by an adder 16. The center lap at the input of multiplier 14 is the reference tap which corresponds to the significant instant of each received symbol. The tap-gain coefficients of the forward filter 1 are derived respectively by the tap-gain controllers 6, 7 and 8. The output of adder 16 is applied to one input of the subtractor 3 where it is combined with the output of backward filter 2. The output of subtractor 3 is fed to the decision circuit 4 that makes a threshold decision on equalized symbols.

The backward filter 2 has two taps formed by a delay element 22 that is connected to the output of decision circuit 4. Decision output signals successively appearing at the delay-line taps of the backward filter 2 are weighted in multipliers 23 and 24 by respective tap-gain coefficients from tap-gain controllers 9 and 10. The output of backward filter 2 is produced by summing the weighted tap signals in an adder 25, where the output of the backward filter is supplied to the subtractor 3. In subtractor 3, the backward filter output is subtracted from the forward filter output to produce a difference signal. This difference signal is an equalized signal on which the threshold decision is performed at decision circuit 4.

The error detector 5 is connected across the input and output of decision circuit 4 to detect an error which might occur in the threshold decision, and it supplies a decision error signal "e" to tap-gain controllers 6 to 10.

All tap-gain controllers 6 to 10 are of identical configuration. As a representative, tap-gain controller 6 is shown in detail. As illustrated, tap-gain controller 6 is connected to a corresponding delay-line tap of forward filter 1 to which tap-gain multiplier 13 is also connected, and comprises a multiplier 17 that multiplies the corresponding tap signal by the derision error signal "e". The output of multiplier 17 is connected to an integrator 18 that integrates the multiplied outputs to determine correlation between the tap signal and the error signal. In the presence of CW interference, the outputs of the integrators in the tap-gain controllers 6, 7 and 8 are such that if they are multiplied by the corresponding tap signals in multipliers 15, 14 and 15 a sharp notch is created in the frequency response of the forward filter 1 at a point corresponding to the frequency of the CW interfering signal. The tap-gain coefficients of backward filter 2 are updated in the tap-gain controllers 9 and 10 so that they cancel intersymbol interference produced in the output of the forward filter 1 as a result of the sharp spectral notch of its frequency response.

In prior art decision feedback equalizers, the outputs of the integrators of tap-gain controllers 6 to 8 are directly connected to the multipliers 13 to 15, respectively. However, if the CW interference disappears suddenly, the tap-gain coefficients held in the integrators for the forward filter 1 tend to keep the same values to continue forming the sharp spectral notch for the forward filter 1. They are no longer optimum when CW interference is nonexistent.

To overcome this problem, each tap-gain controller includes a leakage circuit comprising a signum function circuit 19 connected to the output of integrator 18, a multiplier 20 connected to the output of signum function circuit 19 and a subtractor 21. Signum function circuit 19 produces a positive unit amplitude (+1) if the integrator output is positive regardless of its magnitude or a negative unit amplitude (−1) if the integrator output is negative. The unit amplitude of signum function circuit 19 is used by the multiplier 20 to attach a positive or negative sign to a coefficient β. The output of multiplier 20 is applied to the subtractor 21 where it is subtracted from the output of integrator 18. Thus, the output of subtractor 21 is represented as $C_n - \beta$ sign $C_n$, where $0 < \beta < |C_n|$, where $C_n$ is the output of integrator 18 and n is the signal indicator. The output of leakage subtractor 21 of each tap-gain controller is connected to the corresponding tap-gain multiplier 13 to form a leaky feedback loop and is used by the multiplier 13 as its tap-gain coefficient.

The coefficient β is much smaller than the value $C_n$ produced in the presence of CW interference. As feedback operation proceeds in each tap-gain controller during the absence of CW interference, the forward filter 1 stabilizer and the integrator 18 output settles on an absolute value that is smaller than the coefficient β. Therefore, the absolute values of tap-gain coefficients of both forward and backward filters 1 and 2 constantly converge toward zero, regardless of the presence or absence of CW interference.

Figure 2:
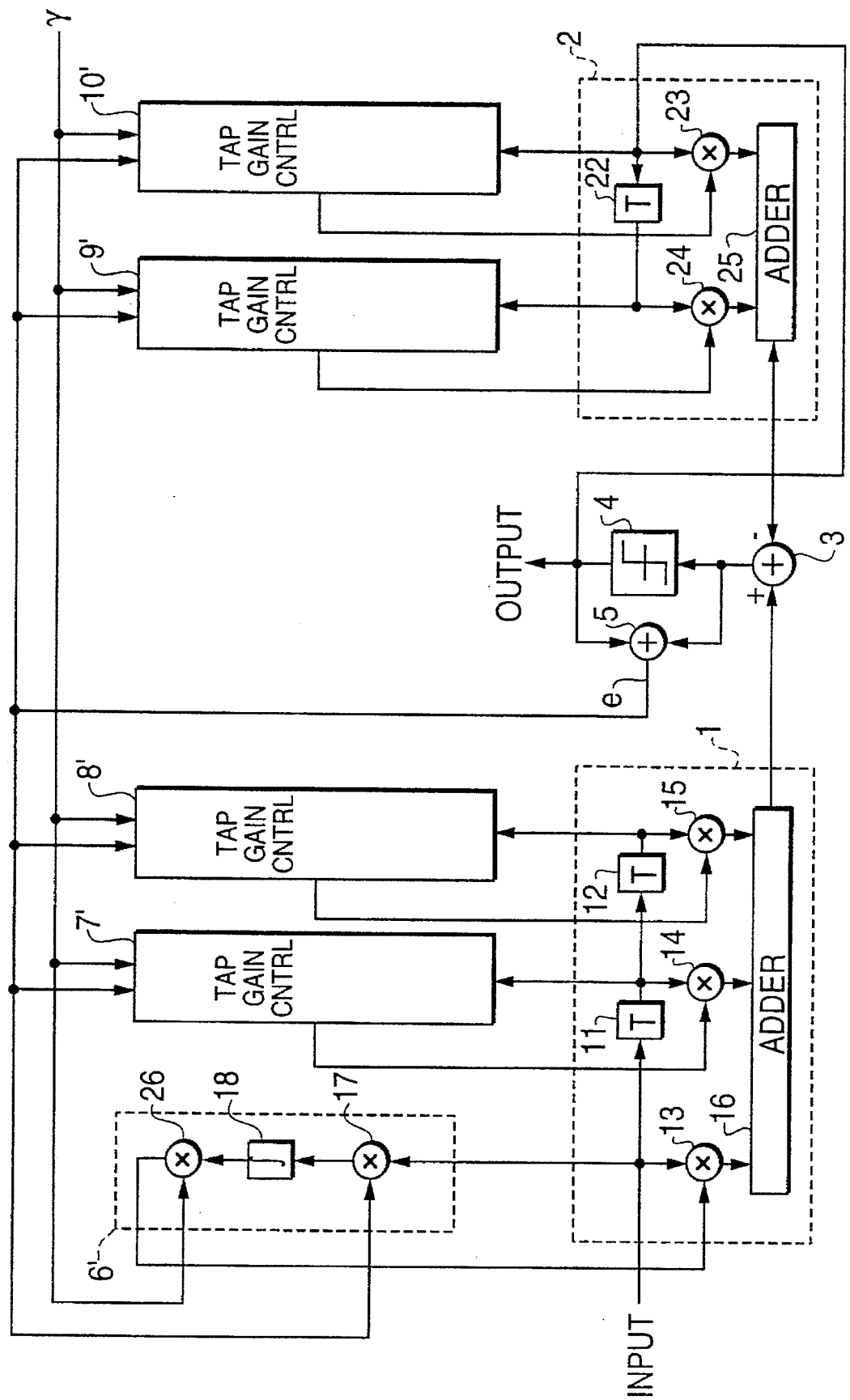
FIG. 2 is a block diagram of a modified decision feedback equalizer of the present invention.

Alternatively, the leakage circuit of each of tap-gain controllers 6' to 10' may consist of a single multiplier 26 as shown in FIG. 2. Multiplier 26 is connected to the output of integrator 18 for scaling the integrator output by a coefficient γ which is greater than 0 and smaller than 1 and supplying its output to the corresponding tap-gain multiplier 13.

The coefficients β and γ are determined so that the convergence speed of all the tap-gain coefficients is not too high or not too low.

What is claimed is:

1. A decision feedback equalizer comprising:

a forward filter having a tapped delay line for receiving an input signal to produce successively delayed tap signals, a plurality of tap-gain multipliers for multiplying said delayed tap signals by respective tap-gain coefficients, and an adder for summing outputs of the tap-gain multipliers, said forward filter forming a spectral notch in the frequency response thereof for canceling continuous wave interference contained in the received signal;

a combiner having a first input for receiving an output of said forward filter and a second input;

a decision circuit for receiving an output from said combiner to produce a decision output;

a decision error detector connected to said decision circuit for detecting a decision error of said decision output;

a backward filter having a tapped delay line for receiving said decision output to produce successively delayed tap signals, a plurality of tap-gain multipliers for multiplying the delayed tap signals by respective tap-gain coefficients, and an adder for summing outputs of the tap-gain multipliers and applying an output of the adder to the second input of said combiner, the backward filter canceling intersymbol interference produced in the decision output as a result of said spectral notch of the forward filter;

a plurality of correlators connected to respectively receive the successively delayed tap signals of the forward and backward filters, each of said correlators detecting a correlation between said decision error and each respective tap signal of one of said forward and backward filters; and a plurality of leakage means connected respectively to said correlators for modifying said correlations and supplying the modified correlations to said forward and backward filters as said tap-gain coefficients so that the tap-gain coefficients converge toward zero;

wherein each of said leakage means comprises:

means for converting a corresponding one of said correlations to a positive unit value or a negative unit value depending on the polarity of the corresponding correlation;

a multiplier for multiplying said positive or negative unit values by a predetermined coefficient which is much smaller in value than the corresponding correlation which is generated during the presence of said continuous wave interference; and a subtractor for subtracting the multiplied positive or negative unit value from said corresponding correlation to produce a difference output as one of said tap-gain coefficients.

* * * * *